(12) United States Patent
Eeh et al.

(10) Patent No.: US 10,873,021 B2
(45) Date of Patent: Dec. 22, 2020

(54) MAGNETIC DEVICE AND MANUFACTURING METHOD OF MAGNETIC DEVICE

(71) Applicants: TOSHIBA MEMORY CORPORATION, Tokyo (JP); SK HYNIX INC., Icheon-si (KR)

(72) Inventors: Young Min Eeh, Seongnam-si Gyeonggi-do (KR); Daisuke Watanabe, Yokkaichi Mie (JP); Jae-Hyoung Lee, Seoul (KR); Toshihiko Nagase, Tokyo (JP); Kazuya Sawada, Seoul (KR); Tadaaki Oikawa, Seoul (KR); Kenichi Yoshino, Seongnam-si Gyeonggi-do (KR); Taiga Isoda, Seoul (KR)

(73) Assignees: TOSHIBA MEMORY CORPORATION, Tokyo (JP); SK HYNIX INC., Gyeonggi-Do (KR)

(*) Notice: Subject to any disclaimer, the term of this patent is extended or adjusted under 35 U.S.C. 154(b) by 0 days.

(21) Appl. No.: 16/123,846

(22) Filed: Sep. 6, 2018

(65) Prior Publication Data

US 2019/0296226 A1    Sep. 26, 2019

(30) Foreign Application Priority Data

Mar. 20, 2018    (JP) .................... 2018-053095

(51) Int. Cl.
*H01L 43/02* (2006.01)
*H01L 27/22* (2006.01)
(Continued)

(52) U.S. Cl.
CPC ............ *H01L 43/02* (2013.01); *G11C 11/161* (2013.01); *H01L 27/228* (2013.01); *H01L 43/10* (2013.01); *H01L 43/12* (2013.01); *G11C 11/165* (2013.01)

(58) Field of Classification Search
None
See application file for complete search history.

(56) References Cited

U.S. PATENT DOCUMENTS 6,166,948 A    12/2000 Parkin et al.
6,801,414 B2    10/2004 Amano et al.
(Continued)

FOREIGN PATENT DOCUMENTS

JP    4230179 B2    2/2009
JP    4729109 B2    7/2011
(Continued)

OTHER PUBLICATIONS

Office Action (Non-Final Rejection) dated Mar. 31, 2020 issued in U.S. Appl. No. 16/352,279.
(Continued)

*Primary Examiner* — Thien F Tran
(74) *Attorney, Agent, or Firm* — Holtz, Holtz & Volek PC

(57) ABSTRACT

According to one embodiment, a magnetic device includes a magnetoresistive effect element including a first ferromagnet, a conductor, and an oxide provided between the first ferromagnet and the conductor, the oxide including a first oxide of a rare-earth element and a second oxide of an element of which a covalent radius is smaller than a covalent radius of the rare-earth element.

13 Claims, 17 Drawing Sheets

(51) Int. Cl.
*H01L 43/12* (2006.01)
*G11C 11/16* (2006.01)
*H01L 43/10* (2006.01)

(56) References Cited

U.S. PATENT DOCUMENTS

| | | | |
|---|---|---|---|
| 7,432,574 | B2 | 10/2008 | Nakamura et al. |
| 9,082,534 | B2 | 7/2015 | Chepulskyy et al. |
| 9,508,926 | B2 | 11/2016 | Kitagawa et al. |
| 2007/0053113 | A1* | 3/2007 | Papworth Parkin .... H01L 43/08 360/324.2 |
| 2008/0291585 | A1 | 11/2008 | Yoshikawa et al. |
| 2009/0243008 | A1 | 10/2009 | Kitagawa et al. |
| 2012/0170357 | A1 | 7/2012 | Apalkov et al. |
| 2013/0163315 | A1 | 6/2013 | Yamane et al. |
| 2014/0374749 | A1* | 12/2014 | Ogimoto ........... H01L 21/02266 257/43 |
| 2016/0171135 | A1 | 6/2016 | Datta et al. |
| 2017/0263858 | A1 | 9/2017 | Sonoda et al. |
| 2019/0080833 | A1 | 3/2019 | Eeh et al. |
| 2020/0091410 | A1 | 3/2020 | Kitagawa et al. |

FOREIGN PATENT DOCUMENTS

| | | |
|---|---|---|
| JP | 2013115412 A | 6/2013 |
| JP | 5951401 B2 | 7/2016 |
| JP | 2019054054 A | 4/2019 |

OTHER PUBLICATIONS

Related U.S. Appl. No. 16/352,279; First Named Inventor: Eiji Kitagawa; Title: "Storage Device"; filed Mar. 13, 2019.

T. Newhouse-Illige, et al., "Voltage-controlled interlayer coupling in perpendicularly magnetized magnetic tunnel functions," Nature Communications, 8:15232, 7 Pages, May 16, 2017.

Expired U.S. Appl. No. 62/394,708, filed Sep. 14, 2016, First Named Inventor: Youngmin Eeh, Title: "Semiconductor Device Having Rare Earth Oxide Layer and Method of Manufacturing the Same".

* cited by examiner

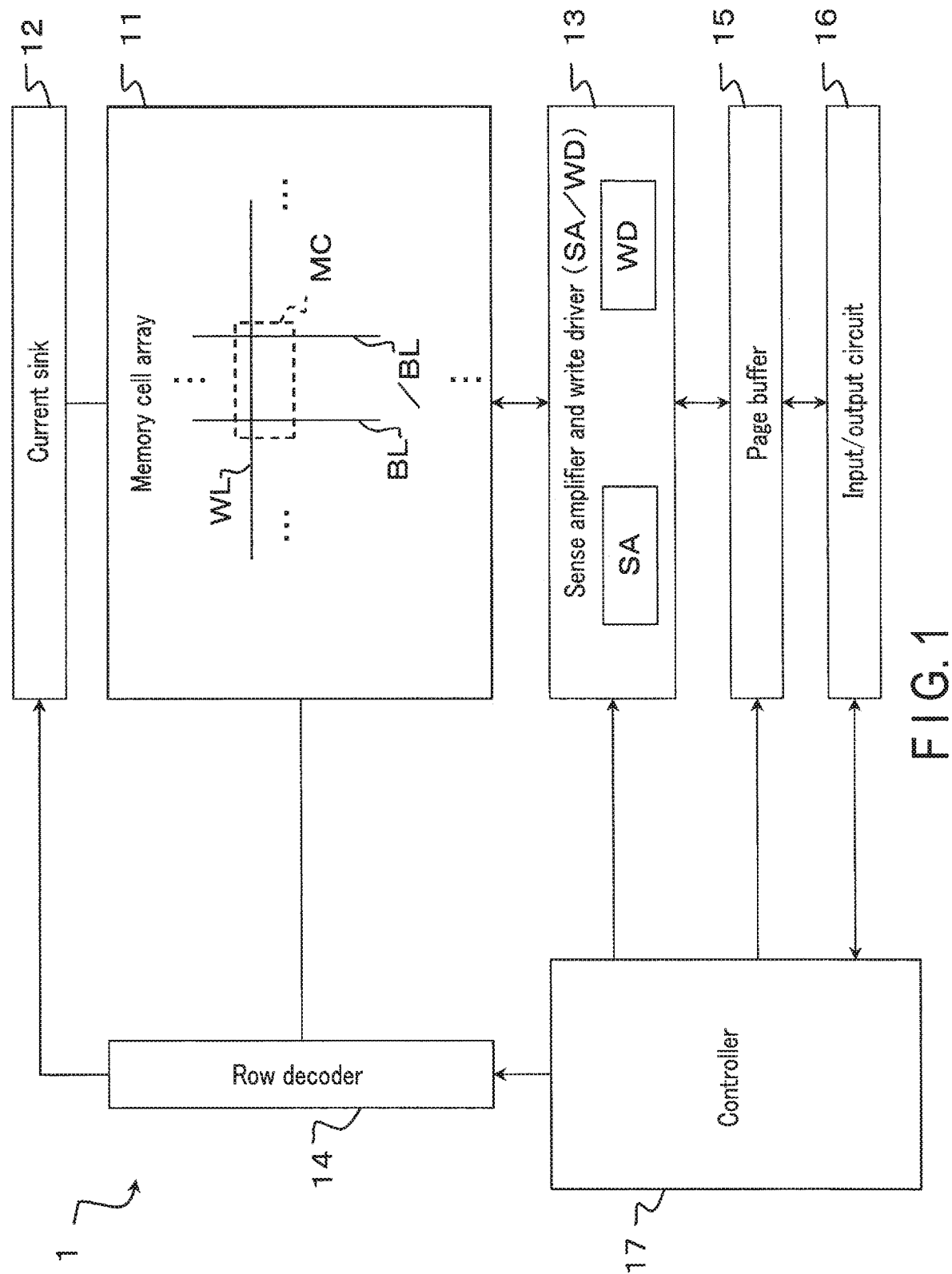
F I G. 1

| Atomic number | Element symbol | Covalent radius (pm) |
|---|---|---|
| 21 | Sc | 170 |
| 39 | Y | 190 |
| 57 | La | 207 |
| 58 | Ce | 204 |
| 59 | Pr | 203 |
| 60 | Nd | 201 |
| 61 | Pm | 199 |
| 62 | Sm | 198 |
| 63 | Eu | 198 |
| 64 | Gd | 196 |
| 65 | Tb | 194 |
| 66 | Dy | 192 |
| 67 | Ho | 192 |
| 68 | Er | 189 |
| 69 | Tm | 190 |
| 70 | Yb | 187 |
| 71 | Lu | 187 |

FIG. 4

| Atomic number | Element symbol | Covalent radius (pm) |
|---|---|---|
| 11 | Na | 166 |
| 12 | Mg | 141 |
| 13 | Al | 121 |
| 14 | Si | 111 |
| 20 | Ca | 176 |
| 22 | Ti | 160 |
| 23 | V | 153 |
| 24 | Cr | 139 |
| 25 | Mn | 139 |
| 30 | Zn | 122 |
| 38 | Sr | 195 |
| 40 | Zr | 175 |
| 41 | Nb | 164 |
| 72 | Hf | 175 |
| 73 | Ta | 170 |

FIG. 5

MAGNETIC DEVICE AND MANUFACTURING METHOD OF MAGNETIC DEVICE

CROSS-REFERENCE TO RELATED APPLICATIONS

This application is based upon and claims the benefit of priority from Japanese Patent Application No. 2018-053095, filed Mar. 20, 2018, the entire contents of which are incorporated herein by reference.

FIELD

Embodiments described herein relate generally to a magnetic device and a manufacturing method of the magnetic device.

BACKGROUND

A magnetic device having a magnetic element is known.

BRIEF DESCRIPTION OF THE DRAWINGS

FIG. 1 is a block diagram for explaining a configuration of a magnetic device according to a first embodiment.

FIG. 4 is a table for explaining rare-earth elements included in an oxide layer of the magnetic device according to the first embodiment.

FIG. 5 is a table for explaining diffusivity adjusting elements included in the oxide layer of the magnetic device according to the first embodiment.

DETAILED DESCRIPTION

Figure 2:
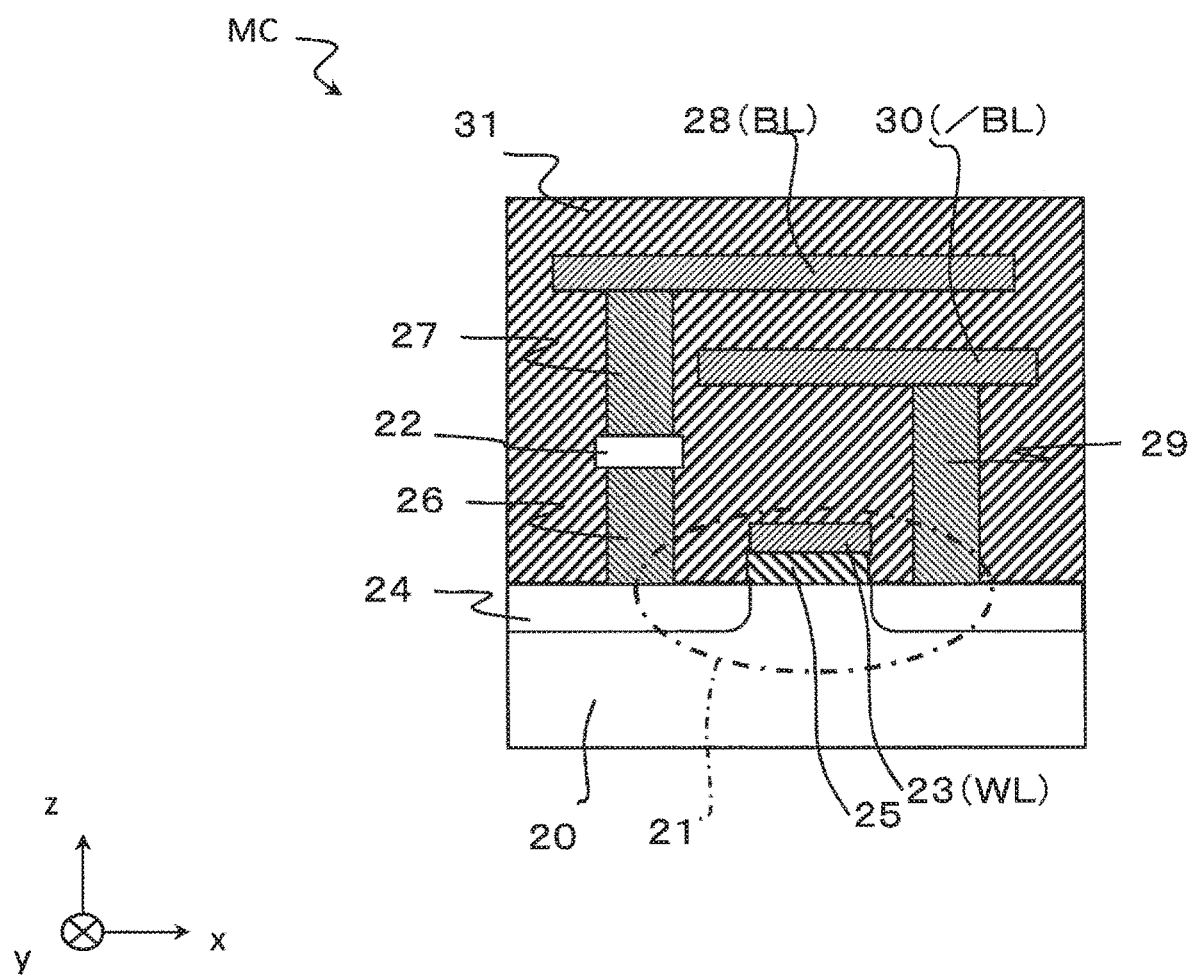
FIG. 2 is a cross-sectional view for explaining a configuration of a memory cell of the magnetic device according to the first embodiment.

In general, according to one embodiment, a magnetic device includes a magnetoresistive effect element including a first ferromagnet, a conductor, and an oxide provided between the first ferromagnet and the conductor, the oxide including a first oxide of a rare-earth element and a second oxide of an element of which a covalent radius is smaller than a covalent radius of the rare-earth element.

Hereinafter, embodiments will be described with reference to the accompanying drawings. Note that in the description, common reference numerals denote components having the same functions and arrangements. To discriminate between a plurality of components having a common reference numeral, additional symbols are added to the common reference numeral. Note that if it is not necessary to specifically discriminate between the plurality of components, the common reference numeral without any additional symbols denotes the plurality of components.

1. First Embodiment

Here, a magnetic device according to a first embodiment will be described. The magnetic device according to the first embodiment includes a magnetic storage device (a magnetoresistive random access memory (MRAM) in this embodiment) of a perpendicular magnetization type that uses a magnetoresistive effect element (namely, a magnetic tunnel junction (MTJ) element) as a storage element.

In the following description, the above-described magnetic storage device will be described as an example of the magnetic device.

1.1 Configuration

First, a configuration of the magnetic device according to the first embodiment will be described.

1.1.1 Configuration of Magnetic Device

FIG. 1 is a block diagram showing a configuration of the magnetic device according to the first embodiment. As shown in FIG. 1, a magnetic device 1 includes a memory cell array 11, a current, sink 12, a sense amplifier and write driver (SA/WD) 13, a row decoder 14, a page buffer 15, an input/output circuit 16, and a controller 17.

The memory cell array 11 includes a plurality of memory cells MC each of which is associated with a row and a column. For example, memory cells MC in the same row are coupled to the same word line WL, one set of ends of the memory cells MC in the same column is coupled to the same bit line BL, and the other set of ends of the memory cells MC in the same column is coupled to the same source line /BL.

The current sink 12 is coupled to a bit line BL and a source line /BL. The current sink 12 sets the bit line BL or the source line /BL to a ground potential, in operations such as data write and read operations.

The SA/WD 13 is coupled to a bit line BL and a source line /BL. The SA/WD 13 supplies a current to a memory cell MC, which is an operation target, via the bit line BL and the source line /BL to write data to the memory cell MC. The SA/WD 13 also supplies a current to the memory cell MC, which is an operation target, via the bit line BL and the source line /BL to read data from the memory cell MC. Specifically, the write driver of the SA/WD 13 writes data to the memory cell MC, and the sense amplifier of the SA/WD 13 reads data from the memory cell MC.

The row decoder 14 is coupled to the memory cell array 11 via word lines WL. The row decoder 14 decodes a row address that designates a row of the memory cell array 11. A word line WL is then selected in accordance with the decoding result, and a voltage necessary for an operation such as data write and data read is applied to the selected word line WL.

The page buffer 15 temporarily stores data to be written to the memory cell array 11 and data read from the memory cell array 11 in a unit of data called a "page."

The input/output circuit 16 sends various signals received from the outside of the magnetic device 1 to the controller 17 and to the page buffer 15, and sends various information received from the controller 17 and the page buffer 15 to the outside of the magnetic device 1.

The controller 17 is coupled to the current sink 12, the SA/WD 13, the row decoder 14, the page buffer 15, and the input/output circuit 16. The controller 17 controls the current sink 12, the SA/WD 13, the row decoder 14, and the page buffer 15 in accordance with the various signals received by the input/output circuit 16 from the outside of the magnetic device 1.

1.1.2 Configuration of Memory Cell Array

Next, a configuration of a memory cell of the magnetic device according to the first embodiment will be described with reference to FIG. 2. In the following description, a surface parallel to the semiconductor substrate 20 is defined as an xy plane, and an axis perpendicular to the xy plane is defined as a z axis. An x axis and a y axis are defined as axes orthogonal to each other in the xy plane. FIG. 2 shows an example a cross-sectional view of the memory cell MC of the magnetic device 1 according to the first embodiment taken along an xz plane.

As shown in FIG. 2, a memory cell MC is provided on the semiconductor substrate 20, and includes a select transistor 21 and a magnetoresistive effect element 22. The select transistor 21 is provided as a switch for controlling supply and stopping of a current at the time of data write to and data read from the magnetoresistive effect element 22. The magnetoresistive effect element 22 includes a plurality of stacked films, and may switch the resistance value between a low-resistance state and a high-resistance state by applying a current in a direction perpendicular to the film surfaces. The magnetoresistive effect element 22 is capable of writing data in accordance with the change of the resistance state, and stores written data in a non-volatile manner to function as a readable storage element.

The select transistor 21 includes a gate coupled to a wiring layer 23 that functions as a word line WL, and a pair of source or drain regions 24 which are provided on the surface of the semiconductor substrate 20 on both sides of the gate along the x-axis direction. In the select transistor 21, the region included in the semiconductor substrate 20 is called an active region. The active region is, for example, isolated by an element separating region (shallow trench isolation (STI)—not shown) so that it is electrically isolated from the active regions of the other memory cells MC.

The wiring layer 23 is provided along the y-axis direction above the semiconductor substrate 20 with an insulation layer 25 interposed therebetween, and, for example, is commonly coupled to the gates of the select transistors 21 (not shown) of the other memory cells MC arranged along the y-axis direction. The wiring layers 23 are arranged in, for example, the x-axis direction.

One end of the select transistor 21 is coupled to a lower surface of the magnetoresistive effect element 22 via a contact plug 26 provided on the source or drain region 24. A contact plug 27 is provided on an upper surface of the magnetoresistive effect element 22. The magnetoresistive effect element 22 is coupled to a wiring layer 28 that functions as a bit line BL via the contact plug 27. The wiring layer 28 extends in the x direction, and, for example, is commonly coupled to the other end of the magnetoresistive effect elements 22 (not shown) of the other memory cells MC arranged in the x direction.

The other end of the select transistor 21 is coupled to a wiring layer 30 that functions as a source line /BL via a contact plug 29 provided on the source or drain region 24. The wiring layer 30 extends in the x direction, and, for example, is commonly coupled to the other end of the select transistors 21 (not shown) of the other memory cells MC arranged in the x direction.

The wiring layers 28 and 30 are, for example, arranged in the y direction. The wiring layer 28 is, for located above the wiring layer 30. The wiring layers 28 and 30 are arranged to avoid physical and electric interference with each other, although this is not specifically shown in FIG. 2. The select transistor 21, the magnetoresistive effect element 22, the wiring layers 23, 28, and 30, and the contact plugs 26, 27, and 29 are covered with an interlayer insulation film 31.

The other magnetoresistive effect elements 22 (not shown) arranged along the x direction or the y direction relative to the magnetoresistive effect element 22 are, for example, provided on the same level. That is, in the memory cell array 11, a plurality of magnetoresistive effect elements 22 are, for example, arranged along the direction to which the semiconductor substrate 20 extends.

1.1.3 Magnetoresistive Effect Element

Figure 3:
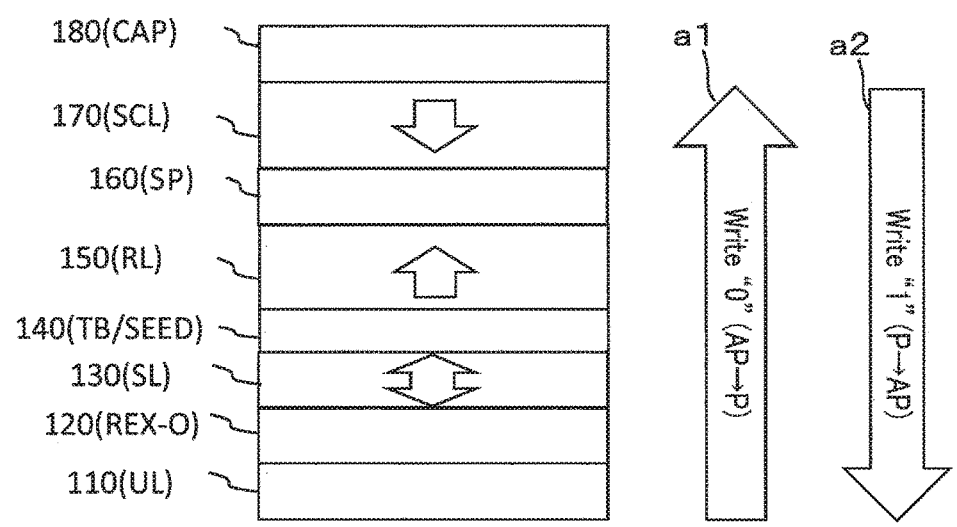
FIG. 3 is a cross-sectional view for explaining a configuration of a magnetoresistive effect element of the magnetic device according to the first embodiment.
Figure 3:
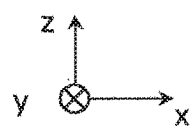

Next, a configuration of the magnetoresistive effect element of the magnetic device according to the first embodiment will be described with reference to FIG. 3. FIG. 3 shows an example of a cross-sectional view of the magnetoresistive effect element of the magnetic device according to the first embodiment taken along the xy plane.

As shown in FIG. 3, the magnetoresistive effect element 22 includes, for example, a non-magnetic layer 110 that functions as an under layer, an oxide layer 120, ferromagnetic layer 130 that functions as a storage layer, a non-magnetic layer 140 that functions as a tunnel barrier layer and a seed layer, a ferromagnetic layer 150 that functions as a reference layer, a non-magnetic layer 160 that functions as a spacer layer, a ferromagnetic layer 170 that functions as a shift canceling layer, and a non-magnetic layer 180 that functions as a capping layer. In FIG. 3 and the subsequent drawings, the non-magnetic layer 110, the oxide layer 120, the ferromagnetic layer 130, the non-magnetic layer 140, the ferromagnetic layer 150, the non-magnetic layer 160, the ferromagnetic layer 170, and the non-magnetic layer 180 are also shown as "UL," "REX-O," "SL," "TB/SEED," "RL," "SP," "SCL," and "CAP," respectively.

In the magnetoresistive effect element 22, a plurality of films are stacked in the z direction in the order of, for example, the non-magnetic layer 110, the oxide layer 120, the ferromagnetic layer 130, the non-magnetic layer 140, the ferromagnetic layer 150, the non-magnetic layer 160, the ferromagnetic layer 170, and the non-magnetic layer 180, from the side of the semiconductor substrate 20. The magnetoresistive effect element 22 is a perpendicular magnetization type MTJ element in which the magnetization direction of each of the ferromagnetic layers 130, 150, and 170 is perpendicular to the film surfaces.

The non-magnetic layer 110 is a layer of a non-magnetic material with electrical conductivity, and includes at least one of the following: a nitrogen compound or an oxygen compound, such as magnesium oxide (MgO), aluminum oxide (AlO), zinc oxide (ZnO), titanium oxide (TiO), magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MON), titanium nitride (TiN), and vanadium nitride (VN). The non-magnetic layer 110 may also include a mixture of the aforementioned nitrogen compound or oxygen compound. In other words, the non-magnetic layer 110 may include not only a binary compound made of two kinds of elements, but also a ternary compound made of three kinds of elements, such as aluminum titanium nitride (AlTiN). A nitride and an oxide, suppress the increase in a damping constant of a magnetic layer coming into contact with these compounds and can achieve an effect which reduces a write current. Furthermore, by using a nitrogen compound or an oxygen compound of a high-melting-point metal, it is possible to suppress diffusion of the under layer material to a magnetic layer and to prevent degradation of an MR ratio. In this description, the high-melting-point metal refers to a material having a melting point higher than that of iron (Fe) and cobalt (Co); and examples thereof are zirconium (Zr), hafnium (Hf), tungsten (W), chromium (Cr), molybdenum (Mo), niobium (Nb), titanium (Ti), tantalum (Ta), and vanadium (V).

The oxide layer 120 includes a layer of an oxide, and the oxide includes an oxide of a rare-earth element (RE). The oxide of the rare-earth element (which may be hereinafter referred to as a rare-earth oxide (RE-O)) includes, for example, an oxide of at least one of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu). A rare-earth element included in the oxide layer 120 has a crystalline structure of which grid spacing of a bond (for example, a covalent bond) is larger than that of the other elements. Therefore, the oxide layer 120 functions to diffuse impurities into the oxide layer 120 in a high-temperature environment (for example, an annealing process) when the ferromagnetic layer 130 adjacent to the oxide layer 120 is non-crystalline structure (in an amorphous state) with the impurities. In other words, the oxide layer 120 has a function of removing the impurities from the ferromagnetic layer 130 in the amorphous state via the annealing process and turning the ferromagnetic layer 130 into a highly-oriented crystal state. The annealing process will be described in detail later.

The oxide layer 120 further includes, in the layer including the rare-earth oxide described above, an oxide of a diffusivity adjusting element (X) of which covalent radius is smaller than a covalent radius of the rare-earth oxide. The oxide of a diffusivity adjusting element (which may be hereinafter referred to as "diffusivity adjusting oxide" (X—O)) includes an element that may be easily oxidized. Specifically, for example, the diffusivity adjusting oxide may include an oxide of at least one of sodium (NA), magnesium (Mg), aluminum (Al), silicon (Si), calcium (Ca), titanium (Ti), vanadium (V), chromium (Cr), manganese (Mn), zinc (Zn), strontium. (Sr), zirconium (Zr), niobium (Nb), hafnium (Hf), or tantalum (Ta) that may be easily oxidized. Since the oxide layer 120 has a structure in which such a diffusivity adjusting element is mixed, the grid spacing of the oxide layer 120 is smaller than the grid spacing of a crystalline structure constituted by only a rare-earth oxide. Thus, in an annealing process, the oxide layer 120 functions to prevent diffusion of a material larger than the impurities by some extent (for example, the ferromagnetic material in the ferromagnetic layer 130), while diffusing the impurities in the ferromagnetic layer 130 into the oxide layer 120. The details of specific combinations of the rare-earth element and the diffusivity adjusting element will be described later.

The oxide layer 120 may further include at least one of boron (B), phosphorus (P), carbon (C), aluminum (Al), silicon (Si), tantalum (Ta), molybdenum (Mo), chromium (Cr), hafnium (Hf), tungsten (W), or titanium (Ti), as impurities.

A parasitic resistance of the oxide layer 120 is preferably smaller than a parasitic resistance of the non-magnetic layer 140. More preferably, the parasitic resistance of the oxide layer 120 is equal to or smaller than 10% of the parasitic resistance of the non-magnetic layer 140. The oxide layer 120 is for example, preferably thinner than a few nm (nanometers) (for example, 2 nm).

The ferromagnetic layer 130 possesses conductivity, is a layer that includes a ferromagnetic material (ferromagnet) having a magnetization easy axis direction that is perpendicular to the film surface, and includes at least one of iron (Fe), cobalt (Co), or nickel (Ni). The ferromagnetic layer 130 may further include at least one of the following impurities: boron (B), phosphorus (P), carbon (C), aluminum (Al), silicon (Si), tantalum (Ta), molybdenum (Mo), chromium (Cr), hafnium (Hf), tungsten (W), or titanium (Ti). Specifically, the ferromagnetic layer 130 may include cobalt-iron-boron (CoFeB) or iron boride (FeB), for example. The ferromagnetic layer 130 has a magnetization direction toward either the semiconductor substrate 20 side or the ferromagnetic layer 150 side. The magnetization direction of the ferromagnetic layer 130 is set to be reversed more easily than the magnetization direction of the ferromagnetic layer 150.

The non-magnetic layer 140 includes a non-magnetic material; for example, at least one of magnesium oxide (MgO), aluminum oxide (AlO), zinc oxide (ZnO), titanium oxide (TiO), or LSMO (lanthanum-strontium-manganese oxide). In crystallization process of the ferromagnetic layers 130 and 150 adjacent to the non-magnetic layer 140, the non-magnetic layer 140 functions as a seed material to become a nucleus for developing crystalline films from interfaces between the non-magnetic layer 140 and the ferromagnetic layers 130 and 150. The crystallization process will be described in detail later.

The ferromagnetic layer 150 possesses conductivity, is a layer that includes a ferromagnetic material having a magnetization easy axis direction that is perpendicular to the film surface, and includes at least one of the following: iron (Fe), cobalt (Co), or nickel (Ni). The ferromagnetic layer 150 may further include at least one of the following impurities: boron (B), phosphorus (P), carbon (C), aluminum (Al), silicon (Si), tantalum (Ta), molybdenum (Mo), chromium (Cr), hafnium (Hf), tungsten (W), or titanium (Ti). Specifically, the ferromagnetic layer 150 may include cobalt-ironboron (CoFeB) or iron boride (FeB), for example. Alternatively, the ferromagnetic layer 150 may include at least one of the following: cobalt platinum (CoPt), cobalt nickel (CoNi), or cobalt palladium (CoPd). A magnetization direction of the ferromagnetic layer 150 is fixed and directed to a side of either the ferromagnetic layer 130 or the ferromagnetic layer 170 (directed to a side of the ferromagnetic layer 170 in the example shown in FIG. 3.) In this description, "a magnetization direction is fixed" means that the magnetization direction is not changed even by an electric current of such a magnitude that the magnetization direction of the ferromagnetic layer 130 can be reversed. By virtue of the non-magnetic layer 140 functioning as a tunnel barrier layer, the ferromagnetic layer 130, the non-magnetic layer 140, and the ferromagnetic layer 150 constitute a magnetic tunnel junction.

The non-magnetic layer 160 is a non-magnetic conductive film, and includes, for example, ruthenium (Ru).

The ferromagnetic layer 170 possesses conductivity, is a layer that includes a ferromagnetic material having a magnetization easy axis direction that is perpendicular to the film surface, and includes at least one of the following: iron (Fe), cobalt (Co), or nickel (Ni). The ferromagnetic layer 150 may further include at least one of the following impurities: boron (B), phosphorus (P), carbon (C), aluminum (Al), silicon (Si), tantalum (Ta), molybdenum (Mo), chromium (Cr), hafnium (Hf), tungsten (W), or titanium (Ti). Specifically, the ferromagnetic layer 150 may include cobalt-iron-boron (CoFeB) or iron boride (FeB), for example. Alternatively, the ferromagnetic layer 150 may include at least one of cobalt platinum (CoPt), cobalt nickel (CoNi), or cobalt palladium (CoPd). The ferromagnetic layer 170 is anti-ferromagnetically combined with the ferromagnetic layer 150 by the non-magnetic layer 160. Accordingly, the magnetization direction of the ferromagnetic layer 170 is fixed to a direction antiparallel to the magnetization direction of the ferromagnetic layer 150 (on the side of the ferromagnetic layer 150 in the example of FIG. 3). Magnetic field intensity necessary for reversing the magnetization direction of the ferromagnetic layer 170 is set larger than the magnetic field intensity necessary for reversing the magnetization direction of the ferromagnetic layer 150. The stray field from the ferromagnetic layer 170 reduces the influence of the stray field from the ferromagnetic layer 150 on a magnetization direction of the ferromagnetic layer 130.

The non-magnetic layer 180 is a layer of a non-magnetic material that has conductivity, and includes at least one of platinum. (Pt), tungsten. (W), tantalum (Ta), or ruthenium (Ru), for example.

In the first embodiment, a spin injection write method is applied in which a write current is directly supplied to the magnetoresistive effect element 22, and the magnetization direction of the ferromagnetic layer 130 is controlled by the write current. The magnetoresistive effect element 22 can take either a low-resistance state or a high-resistance state, depending on whether the relative relationship between the Magnetization directions of the ferromagnetic layers 130 and 150 is parallel or antiparallel.

If a write current in the direction of an arrow a1 in FIG. 3, that is, in a direction from the ferromagnetic layer 130 toward the ferromagnetic layer 150, is supplied with the magnetoresistive effect element 22, the relative relationship between the magnetization directions of the ferromagnetic layers 130 and 150 becomes parallel. In this parallel state, the resistance value of the magnetoresistive effect element 22 becomes the lowest, and the magnetoresistive effect element 22 is set to a low-resistance state. This low-resistance state is called "P (parallel) state", and defined as a data "0" state.

If a write current in the direction of an arrow a2 in FIG. 3, that is, in a direction from the ferromagnetic layer 150 toward the ferromagnetic layer 130, is supplied with the magnetoresistive effect element 22, the relative relationship between the magnetization directions of the ferromagnetic layers 130 and 150 becomes antiparallel. In this antiparallel state, the resistance value of the magnetoresistive effect element 22 becomes the highest, and the magnetoresistive effect element 22 is set to a high-resistance state. This high-resistance state is called "AP (anti-parallel) state", and is defined as a data "1" state.

1.1.4 Combinations of Rare-Earth Element and Diffusivity Adjusting Element

Next, specific combinations of the rare-earth element and the diffusivity adjusting element in the oxide layer according to the first embodiment will be described with reference to FIG. 4 and FIG. 5.

FIG. 4 is a table for explaining covalent radii of rare-earth elements that may be included in the oxide layer of the magnetic device according to the first embodiment.

FIG. 5 is a table for explaining covalent radii of diffusivity adjusting elements that may be included in the oxide layer of the magnetic device according to the first embodiment. FIGS. 4 and 5 specifically show atomic numbers, element symbols, and covalent radii associated with each other.

As shown in FIG. 4, the covalent radii (unit: picometer (pm)) of the rare-earth elements that may be included in the oxide layers 120 are as follows, for example:

The covalent radius of scandium (Sc) of atomic number 21 is 170 pm. The covalent radius of yttrium (Y) of atomic number is 190 pm. The covalent radius of lanthanum (La) of atomic number 57 is 207 pm. The covalent radius of cerium (Ce) of atomic number 58 is 204 pm. The covalent radius of praseodymium (Pr) of atomic number 59 is 203 pm. The covalent radius of neodymium. (Nd) of atomic number 60 is 201 pm. The covalent radius of promethium (Pm) of atomic number 61 is 199 pm. The covalent radius of samarium (Sm) of atomic number 62 is 198 pm. The covalent radius of europium (Eu) of atomic number 63 is 198 pm. The covalent radius of gadolinium (Gd) of atomic number 64 is 196 pm. The covalent radius of terbium (Tb) of atomic number 65 is 194 pm. The covalent radius of dysprosium (Dy) of atomic number 66 is 192 pm. The covalent radius of holmium (Ho) of atomic number 67 is 192 pm. The covalent radius of erbium (Er) of atomic number 68 is 189 pm. The covalent radius of thulium (Tm) of atomic number 69 is 190 pm. The covalent radius of ytterbium (Yb) of atomic number 70 is 187 pm. The covalent radius of lutetium (Lu) of atomic number 71 is 187 pm.

As shown in FIG. 5, the covalent radii of the diffusivity adjusting elements that may be included in the oxide layers 120 are as follows, for example:

The covalent radius of sodium (Na) of atomic number 11 is 166 pm. The covalent radius of magnesium (Mg) of atomic number 12 is 141 pm. The covalent radius of aluminum (Al) of atomic number 13 is 121 pm. The covalent radius of silicon (Si) of atomic number 14 is 111 pm. The covalent radius of calcium (Ca) of atomic number 20 is 176 pm. The covalent radius of titanium (Ti) of atomic number 22 is 160 pm. The covalent radius of vanadium (V) of atomic number 23 is 153 pm. The covalent radius of chromium (Cr) of atomic number 24 is 139 pm. The covalent radius of manganese (Mn) of atomic number 25 is 139 pm. The covalent radius of zinc (Zn) of atomic number 30 is 122 pm.

The covalent radius of strontium (Sr) of atomic number 38 is 195 pm. The covalent radius of zirconium (Zr) of atomic number 40 is 175 pm. The covalent radius of niobium (Nb) of atomic number 41 is 164 pm. The covalent radius of hafnium (Hf) of atomic number 72 is 175 pm. The covalent radius of tantalum (Ta) of atomic number 73 is 170 pm.

Referring to FIGS. 4 and 5, for example, if scandium (Sc) is selected from the rare-earth elements shown in FIG. 4, at least one of sodium (Na), magnesium (Mg), aluminum (Al), silicon (Si), titanium (Ti), vanadium (V), chromium (Cr), manganese (Mn), zinc (Zn), or niobium (Nb) may be selected from the diffusivity adjusting elements shown in FIG. 5.

For example, if yttrium (Y) is selected from the rare-earth elements shown in FIG. 4, at least one of all the diffusivity adjusting elements shown in FIG. 5 other than strontium (Sr) may be selected.

For example, if gadolinium (Gd) is selected from the rare-earth elements shown in FIG. 4, at least one of all the diffusivity adjusting elements shown in FIG. 5 may be selected.

1.2. Manufacturing Method of Magnetoresistive Effect Element

Next, a manufacturing method of the magnetoresistive effect element of the magnetic device according to the first embodiment will be described. In the following description, a manufacturing method of the ferromagnetic layer 130 (a storage layer SL) among the structural elements in the magnetoresistive effect element 22 will be described, and a description of the other structural elements will be omitted.

Figure 6:
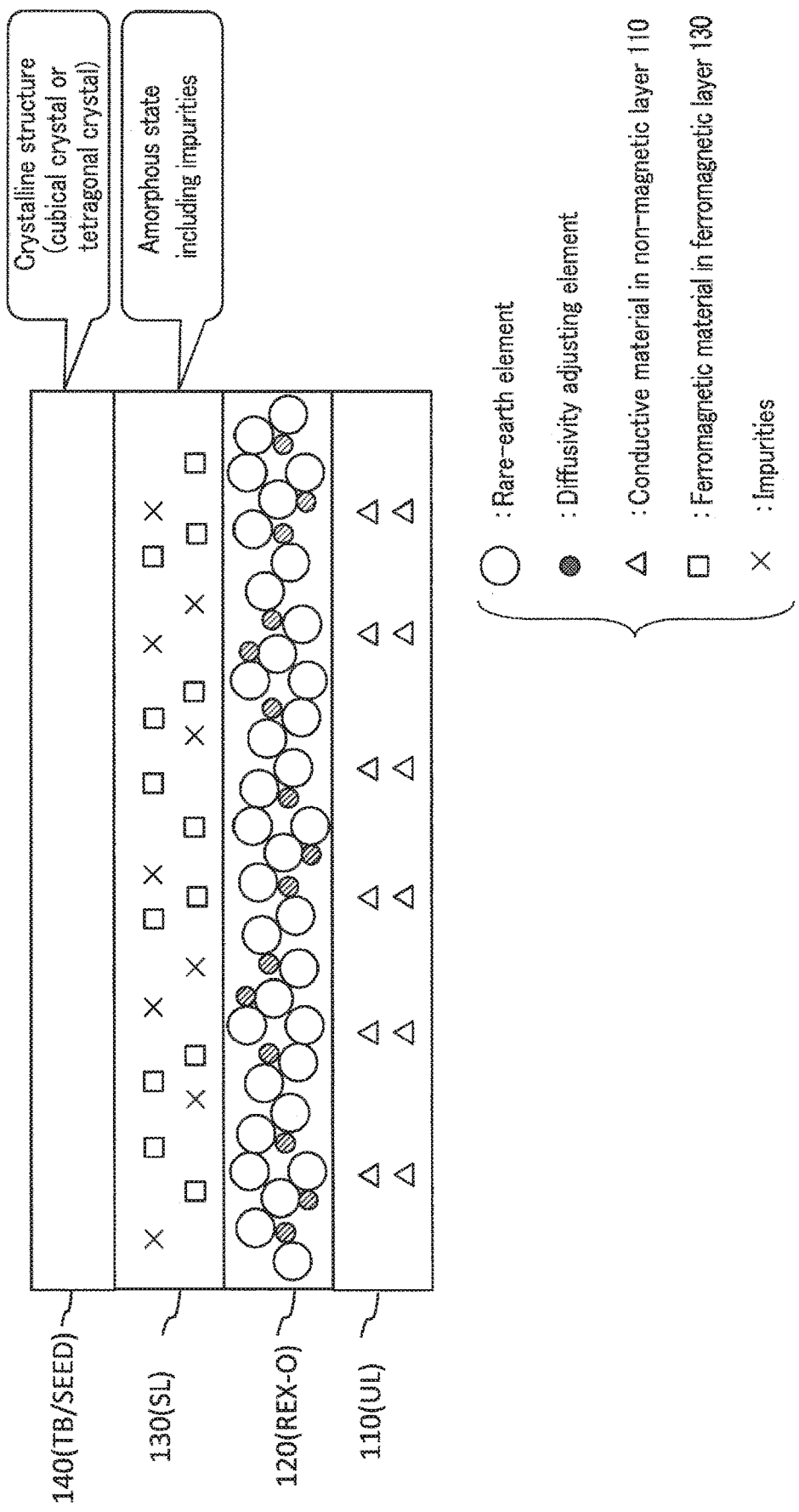
FIG. 6 is a schematic view for explaining a manufacturing method of the magnetoresistive effect element of the magnetic device according to the first embodiment.
Figure 7:
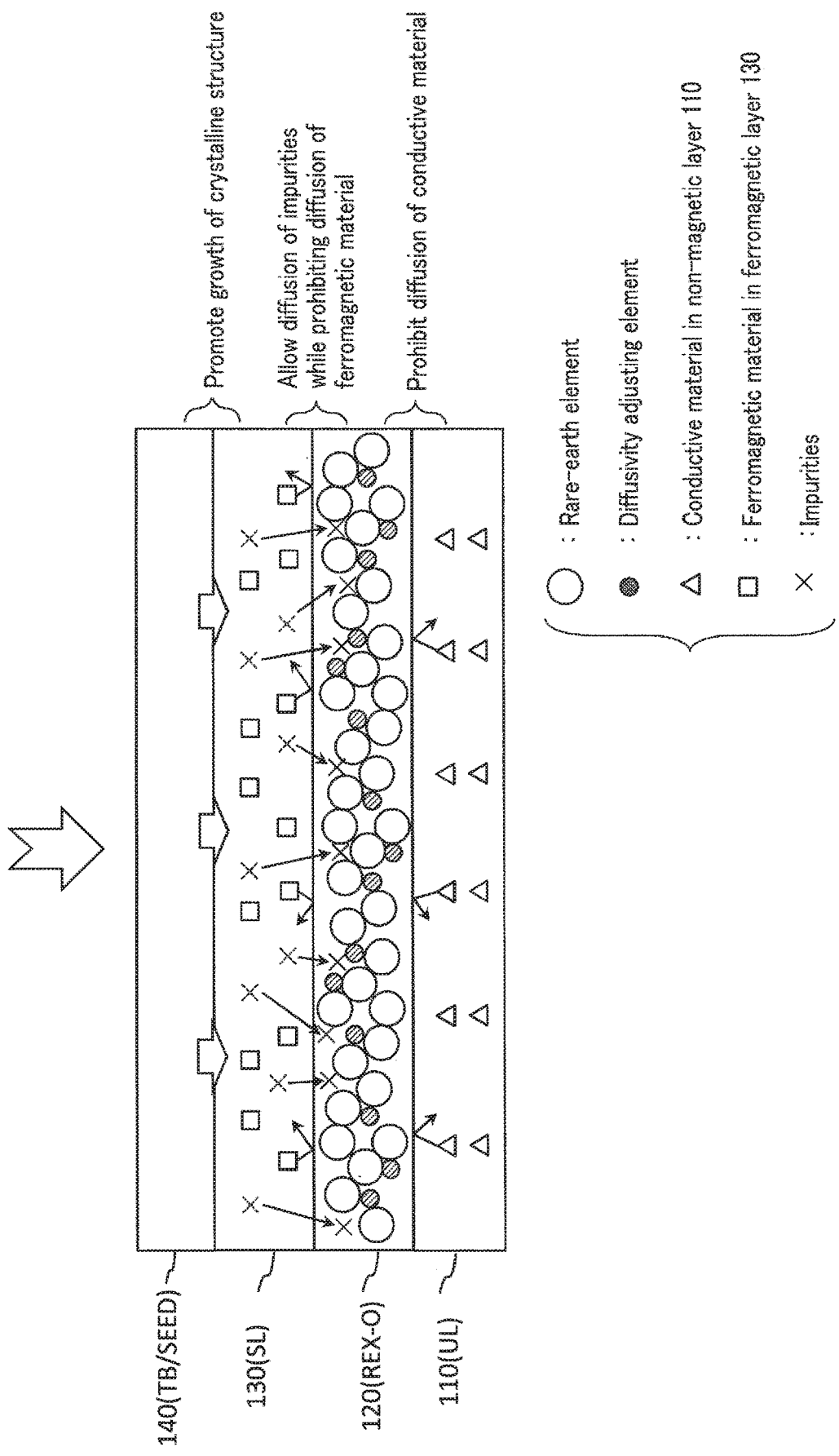
FIG. 7 is a schematic view for explaining a manufacturing method of the magnetoresistive effect element of the magnetic device according to the t embodiment.
Figure 8:
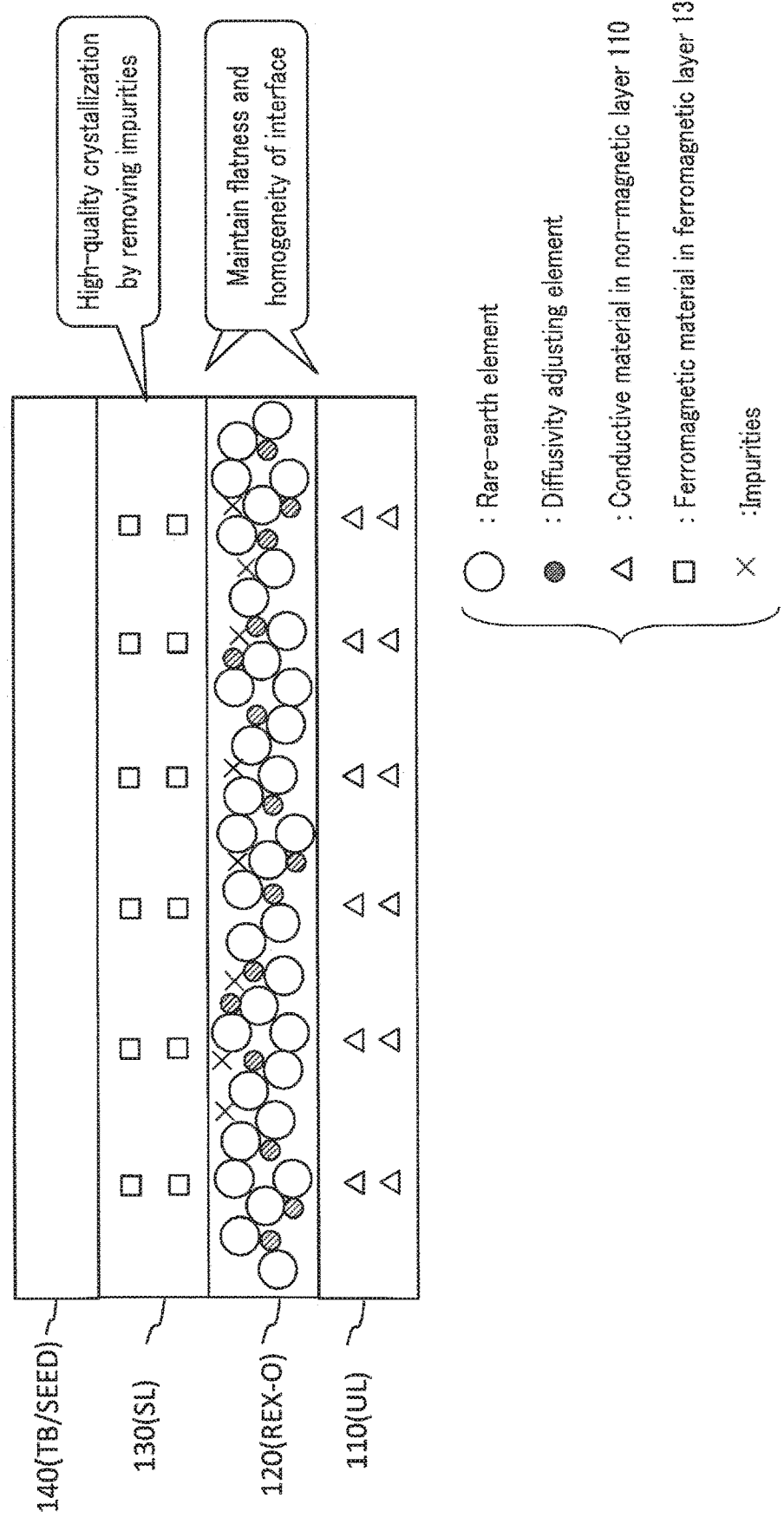
FIG. 8 is a schematic view for explaining a manufacturing method of the magnetoresistive effect element of the magnetic device according to the first embodiment.

FIGS. 6, 7, and 8 are schematic diagrams illustrating the manufacturing method of the magnetoresistive effect element, of the magnetic device according to the first embodiment. FIGS. 6, 7, and 8 show a process in which the ferromagnetic layer 130 is transformed from an amorphous state to a crystal state by the annealing process. The ferromagnetic layer 150, the non-magnetic layer 160, the ferromagnetic layer 170, and the non-magnetic layer 180 stacked above the non-magnetic layer 140 are not shown for simplicity.

As shown in FIG. 6, the non-magnetic layer 110, the oxide layer 120, the ferromagnetic layer 130, and the non-magnetic layer 140 are stacked in this order. The oxide layer 120 includes an oxide of a rare-earth element and an oxide of a diffusivity adjusting element. The oxide layer 120 is formed by, for example, co-sputtering (for example, the rare-earth element and the diffusivity adjusting element). Since the oxide layer 120 includes the oxide of the diffusivity adjusting element, the oxide layer 120 may behave as if in an amorphous state. The ferromagnetic layer 130 is stacked as an amorphous layer including impurities. The non-magnetic layer 140 has, for example, a crystalline structure of a cubical crystal or a tetragonal crystal.

In FIG. 6 and the subsequent drawings, the rare-earth element is represented by "○" with a large diameter, and the diffusivity adjusting element is represented by hatched "○" with a small diameter, for convenience. A conductive material in the non-magnetic layer 110 is represented by "Δ," the ferromagnetic material in the ferromagnetic layer 130 is represented by "□," and the impurities included in the ferromagnetic layer 130 when stacking the layers is represented by "x."

Next, as shown in FIG. 7, the annealing process is performed on each layer stacked as shown in FIG. 6. Specifically, the ferromagnetic layer 130 is transformed from amorphous to crystalline by applying heat to each layer from outside. Here, the non-magnetic layer 140 functions to control the orientation of the crystalline structure of the ferromagnetic layer 130. In other words, the ferromagnetic layer 130 develops its crystalline structure by using the non-magnetic layer 140 as a seed material (a crystallization process). Accordingly, the crystal plane of the ferromagnetic layer 130 is oriented on the same plane as the crystal plane of the non-magnetic layer 140.

As the ferromagnetic layer 130 develops a crystalline structure, the impurities "x" included in the ferromagnetic layer 130 are diffused into the oxide layer 120. The grid spacing of the rare-earth element and the grid spacing of the diffusivity adjusting element included in the oxide layer 120 are large to the extent that the impurities "x" are not prevented from diffusing. Accordingly, the impurities "x" immediately diffuse from the ferromagnetic layer 130 to the oxide layer 120. This diffusion of the impurities can promote crystallization of the ferromagnetic layer 130.

In response to the heat applied by the annealing process, the ferromagnetic material "□" included in the ferromagnetic layer 130 also tries to diffuse out of the ferromagnetic layer 130. The grid spacing of the rare-earth element included in the oxide layer 120 is large to the extent that the ferromagnetic material "□" is not prevented from diffusing. However, the grid spacing of the diffusivity adjusting element included in the oxide layer 120 is small to the extent that the ferromagnetic material "□" may be prevented from diffusing. Thus, diffusion of the ferromagnetic material "□" from the ferromagnetic layer 130 into the oxide layer 120 is suppressed. As a result, impediments to crystallization of the ferromagnetic layer 130 can be suppressed.

Furthermore, in response to the heat applied by the annealing process, the conductive material "Δ" included in the non-magnetic layer 110 also tries to diffuse out of the non-magnetic layer 110. The grid spacing of the rare-earth element included in the oxide layer 120 is large to the extent that the conductive material "Δ" is not prevented from diffusing. However, the grid spacing of the diffusivity adjusting element included in the oxide layer 120 is small to the extent that the conductive material "Δ" may be prevented from diffusing. Thus, diffusion of the conductive material "Δ" from the non-magnetic layer 110 into the oxide layer 120 is suppressed. As a result, diffusion of the conductive material "Δ" into the ferromagnetic layer 130 via the oxide layer 120 may be suppressed, meaning that impediments to crystallization of the ferromagnetic layer 130 can be suppressed.

Then, the annealing process ends, as shown in FIG. 8. The oxide layer 120 takes most of the impurities "x" out of the ferromagnetic layer 130, while suppressing diffusion of the ferromagnetic material "□" (necessary for crystallization of the ferromagnetic layer 130) out of the ferromagnetic layer 130. The oxide layer 120 also suppresses inflow of new impurities into the ferromagnetic layer 130 by suppressing the diffusion of the conductive material "Δ" from the non-magnetic layer 110. As a result, the ferromagnetic layer 130 may undergo high-quality crystallization. It is preferable that the impurities "x" do not remain in the ferromagnetic layer 130; however, a small amount of the impurities "x" may remain in the ferromagnetic layer 130. In such a case, the ferromagnetic layer 130 and the oxide layer 120 may include the same impurities "x."

Furthermore, since the oxide layer 120 includes the diffusivity adjusting element, the oxide layer 120 maintains the amorphous state even after the annealing process. Accordingly, flatness and homogeneity of the interfaces of the oxide layer 120 may be maintained. Thus, deterioration of flatness and homogeneity of the interfaces of the layers above the oxide layer 120 may be suppressed.

This constitutes the end of the manufacturing of the magnetoresistive effect element 22.

1.3 Advantageous Effects of Present Embodiment

According to the first embodiment, the magnetoresistive effect element may obtain high perpendicular magnetic anisotropy and a high magnetoresistive effect, while preventing diffusion of a magnetic material. This effect will be described below.

In the first embodiment, the magnetoresistive effect element 22 includes the non-magnetic layer 110, the ferromagnetic layer 130, and the oxide layer 120 provided between the non-magnetic layer 110 and the ferromagnetic layer 130. The oxide layer 120 includes an oxide of a rare-earth element and an oxide of a diffusivity adjusting element. The covalent radius of the diffusivity adjusting element is selected to be smaller than the covalent radius of the rare-earth element. As a result, the diffusivity adjusting element is arranged to fill the gap of the grid spacing of the rare-earth element. Thus, the oxide layer 120 has a higher effect of suppressing diffusion of elements compared to a layer constituted by only an oxide of a rare-earth element. Specifically, for example, the oxide layer 120 allows for diffusion of impurities in the ferromagnetic layer 130, such as boron (B), of which the covalent radius is relatively small, but can suppress diffusion of a ferromagnetic material, such as iron (Fe) and cobalt (Co), of which the covalent radius is larger than the covalent radius of such impurities. Accordingly, it is possible to remove impurities from the ferromagnetic layer 130 and suppress diffusion of the ferromagnetic material in the annealing process, and thus the ferromagnetic layer 130 may become a crystalline material of good quality.

Furthermore, the oxide layer 120 may suppress diffusion of a conductive material such as molybdenum (Mo) and tungsten (W) in the non-magnetic layer 110. As a result, diffusion of such a conductive material into the ferromagnetic layer 130 via the oxide layer 120 may be suppressed. Thus, the ferromagnetic layer 130 can gain a high magnetoresistive effect and high perpendicular magnetic anisotropy.

In the magnetoresistive effect element 22, the non-magnetic layer 140 is provided between the ferromagnetic layer 130 and the ferromagnetic layer 150. Accordingly, in the annealing process, the ferromagnetic layers 130 and 150 may develop their crystal structures by using the non-magnetic layer 140 as a seed material. Therefore, the ferromagnetic layers 130 and 150 can be transformed from an amorphous state to a highly-oriented crystal state, and can eventually obtain high interface magnetic anisotropy.

The oxide layer 120 is designed to have a smaller parasitic resistance than a parasitic resistance of the non-magnetic layer 140. Thereby, it is possible to suppress excessive increase of the write current applied to the magnetoresistive effect element 22. Accordingly, the magnetoresistive effect element 22 can be easily applied to a magnetic storage device.

2. Modifications

Embodiments are not limited to the first embodiment described above but can be modified in various ways.

2.1 First Modification

The first embodiment describes the case where the oxide layer 120 is formed as a single layer including the rare-earth oxide and the diffusivity adjusting oxide; however, the configuration is not limited thereto. For example, the oxide layer 120 may be formed as a plurality of layers that contain a layer including the rare-earth oxide and a layer including the diffusivity adjusting oxide.

Hereinafter, only the matters which differ from the first embodiment will be described.

Figure 9:
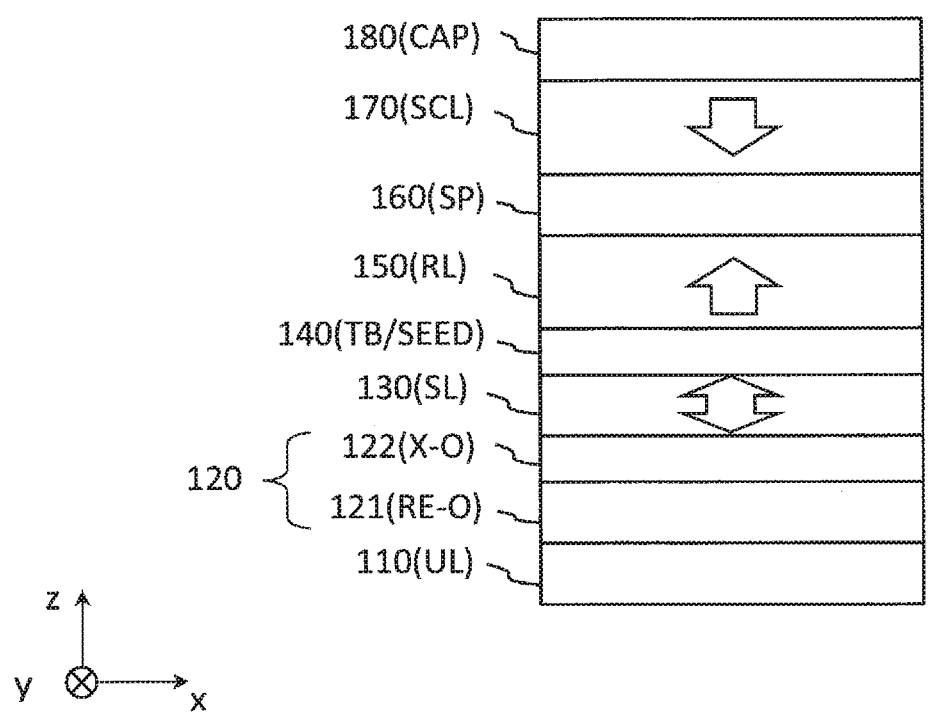
FIG. 9 is a cross-sectional view for explaining a configuration of a magnetoresistive effect element of a magnetic device according to a first modification of the first embodiment.

FIG. 9 is a cross-sectional view for explaining a configuration of a magnetoresistive effect element of a magnetic device according to a first modification of the first embodiment. FIG. 9 corresponds to FIG. 3 described in the first embodiment.

As shown in FIG. 9, an oxide layer 120 includes a rare-earth oxide layer 121 and a diffusivity adjusting oxide layer 122. The rare-earth oxide layer 121 and a diffusivity adjusting oxide layer 122 are stacked in a z-axis direction in this order. In FIG. 9 and the subsequent drawings, the rare-earth oxide layer 121 is shown as "RE-O," and the diffusivity adjusting oxide layer 122 is shown as "X—O."

The rare-earth oxide layer 121 includes a rare-earth oxide. The rare-earth oxide may include, for example, a configuration equivalent to the configuration of the rare-earth oxide in the oxide layers 120 described in the first embodiment. The rare-earth element constituting the rare-earth oxide layer 121 possesses a crystalline structure of which grid spacing of the covalent bond is larger than the grid spacing of the covalent bond of the other elements. Thus, in an annealing process, the rare-earth oxide layer 121 functions to diffuse impurities in the ferromagnetic layer 130 into the rare-earth oxide layer 121.

The diffusivity adjusting oxide layer 122 includes an oxide of a diffusivity adjusting element. The diffusivity adjusting oxide may include a configuration equivalent to the configuration of the diffusivity adjusting oxide in the oxide layer 120 described in the first embodiment. A covalent radius of a diffusivity adjusting element included in the diffusivity adjusting oxide layer 122 is smaller than the covalent radius of the rare-earth element. Accordingly, the diffusivity adjusting oxide layer 122 have a crystalline structure of which grid spacing is larger than the grid spacing of the rare-earth oxide layers 121. Thus, in an annealing process, the diffusivity adjusting oxide layer 122 functions to diffuse the impurities in the ferromagnetic layer 130 into the diffusivity adjusting oxide layer 122, while preventing diffusion of a material which is larger than the impurities by some extent (for example, the ferromagnetic material in the ferromagnetic layer 130).

In the above configuration, the rare-earth oxide layer 121 and the diffusivity adjusting oxide layer 122 allow for diffusion of the impurities from the ferromagnetic layer 130, and the diffusivity adjusting oxide layer 122 suppresses diffusion of the ferromagnetic material from the ferromagnetic layer 130. As a result, the ferromagnetic layer 130 may undergo high-quality crystallization by the annealing process.

2.2 Second Modification

The first modification of the first embodiment describes the case where the diffusivity adjusting oxide layer is formed on the upper surface of the rare-earth oxide layer; however, the configuration is not limited thereto. For example, the diffusivity adjusting oxide layer may be formed on the lower surface of the rare-earth oxide layer.

In the following description, only the matters which differ from the first modification of the first embodiment will be described.

Figure 10:
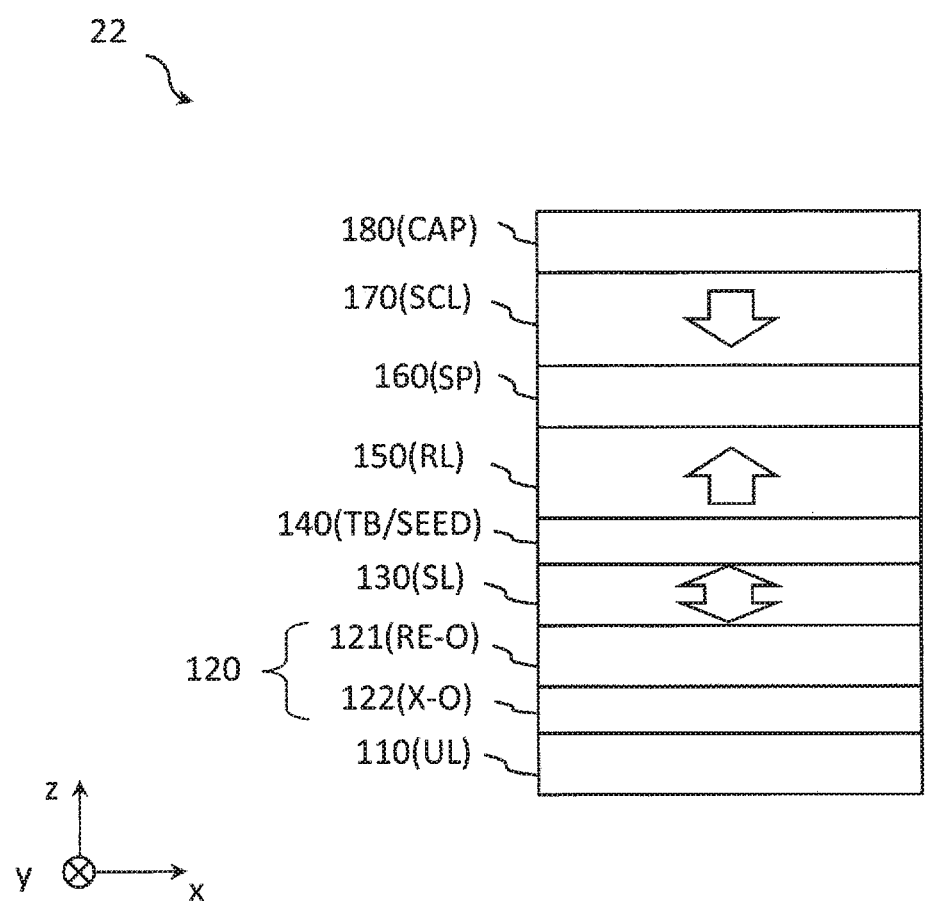
FIG. 10 is a cross-sectional view for explaining a configuration of a magnetoresistive effect element of a magnetic device according to a second modification of the first embodiment.

FIG. 10 is a cross-sectional view for explaining a configuration of a magnetoresistive effect element of a magnetic device according to a second modification of the first embodiment. FIG. 10 corresponds to FIG. 3 described in the first embodiment.

As shown in FIG. 10, the diffusivity adjusting oxide layer 122 and the rare-earth oxide layer 121 are stacked in the z-axis direction in this order.

In the above configuration, the rare-earth oxide layer 121 and the diffusivity adjusting oxide layer 122 allow for diffusion of the impurities from the ferromagnetic layer 130, and the diffusivity adjusting oxide layer 122 suppresses diffusion of the ferromagnetic material from the ferromagnetic layer 130. As a result, the ferromagnetic layer 130 may undergo high-quality crystallization by the annealing process.

2.3 Third Modification

The first and second modifications of the first embodiment describe the cases where one diffusivity adjusting oxide layer and one rare-earth oxide layer are provided in an oxide layer; however, the configuration is not limited thereto. For example, a plurality of diffusivity adjusting oxide layers and a plurality of rare-earth oxide layers may be stacked in an oxide layer.

In the following description, only the matters which differ from the first modification of the first embodiment will be described.

Figure 11:
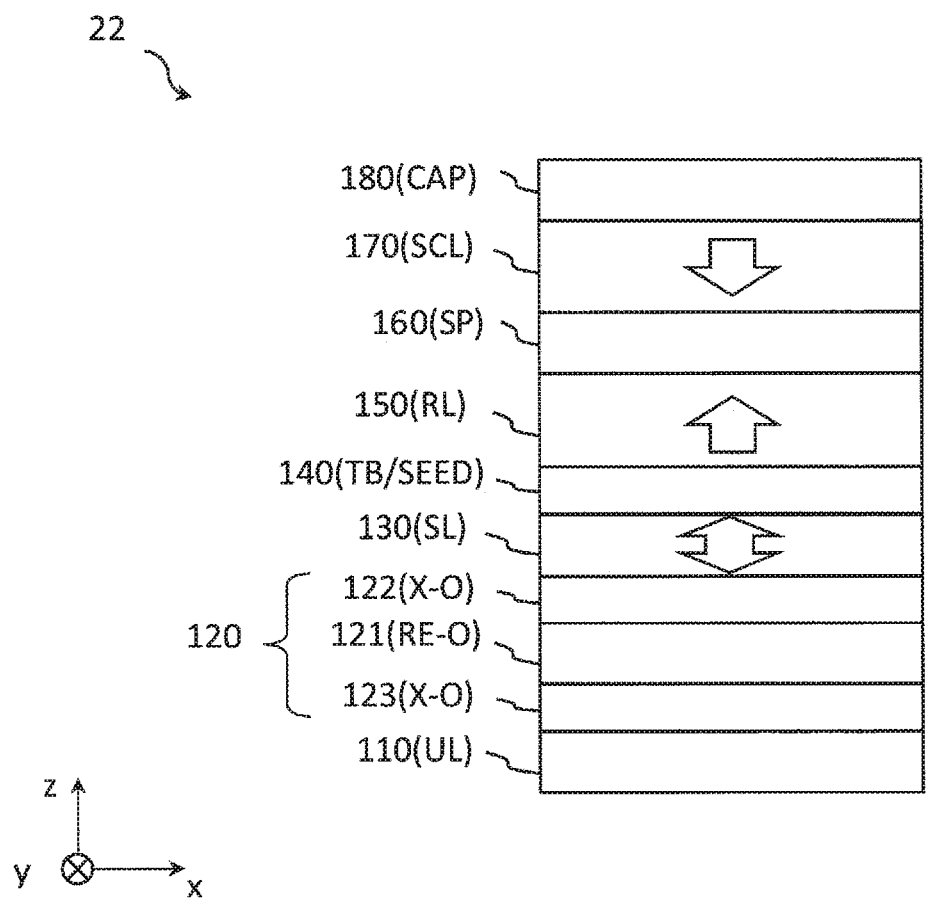
FIG. 11 is a cross-sectional view for explaining a configuration of a magnetoresistive effect element of a magnetic device according to a third modification of the first embodiment.

FIG. 11 is a cross-sectional view for explaining a configuration of a magnetoresistive effect element of a magnetic device according to a third modification of the first embodiment. FIG. 11 corresponds to FIG. 9 described in the first modification of the first embodiment.

As shown in FIG. 11, the oxide layer 120 includes the rare-earth oxide layer 121 and the diffusivity adjusting oxide layer 122, and further includes a diffusivity adjusting oxide layer 123. The diffusivity adjusting oxide layer 123, the rare-earth oxide layer 121, and the diffusivity adjusting oxide layer 122 are stacked in this order in the z-axis direction. The diffusivity adjusting oxide layer 123 does not necessarily include a configuration same as the configuration of the diffusivity adjusting oxide layer 122, but includes at least one of the elements that may be included as a diffusivity adjusting oxide described in the first embodiment.

In the above configuration, the diffusivity adjusting oxide layer 123 may directly suppress diffusion of the conductive material from the adjacent non-magnetic layer 110, and thus may suppress diffusion of the conductive material in the non-magnetic layer 110 into the rare-earth oxide layer 121. The diffusivity adjusting oxide layer 122 may directly suppress diffusion of the ferromagnetic material from the adjacent ferromagnetic layer 130, and thus may suppress diffusion of the ferromagnetic material in the ferromagnetic layer 130 into the rare-earth oxide layer 121.

2.4 Fourth Modification

The third modification of the first embodiment describes the case where a rare-earth oxide layer is provided between two diffusivity adjusting oxide layers; however, the configuration is not limited thereto. For example, a diffusivity adjusting oxide layer may be provided between two rare-earth oxide layers.

In the following description, only the matters which differ from the second modification of the first embodiment will be described.

Figure 12:
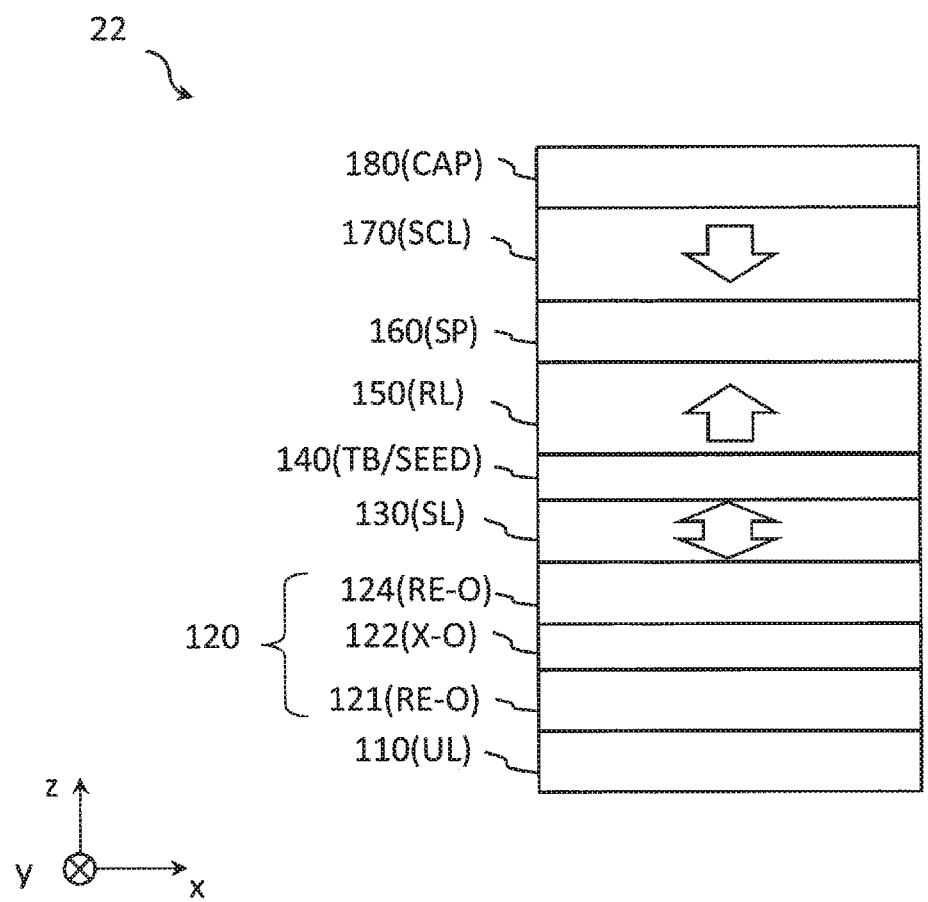
FIG. 12 is a cross-sectional view for explaining a configuration of a magnetoresistive effect element of a magnetic device according to a fourth modification of the first embodiment.

FIG. 12 is a cross-sectional view illustrating a configuration of a magnetoresistive effect element of a magnetic device according to a fourth modification of the first embodiment. FIG. 12 corresponds to FIG. 10 described in the second modification of the first embodiment.

As shown in FIG. 12, the oxide layer 120 includes the rare-earth oxide layer 121 and the diffusivity adjusting oxide layer 122, and further includes a rare-earth oxide layer 124. The rare-earth oxide layer 121, the diffusivity adjusting oxide layer 122, and the rare-earth oxide layer 124 are stacked in this order in the z-axis direction. The rare-earth oxide layer 124 does not necessarily include a configuration same as the configuration of the rare-earth oxide layer 121, but contains at least one of the elements that may be included as a rare-earth oxide described in the first embodiment.

In the above configuration, crystallization of the ferromagnetic layers 130 is promoted more.

3. Others

The above first embodiment and modifications describe the case where the magnetoresistive effect element 22 is a bottom-free type in which the storage layer SL is provided on the semiconductor substrate 20 side. However, the magnetoresistive effect element 22 may be a top-free type in which the reference layer RL is provided on the semiconductor substrate 20 side.

FIG. 13 through FIG. 17 show examples of a cross-sectional view of a magnetoresistive effect element 22 of a top-free type. FIG. 13 through FIG. 17 show the magnetoresistive effect element 22 shown in FIG. 3 and FIG. 9 through FIG. 12, changed to a top-free type, respectively.

Figure 13:
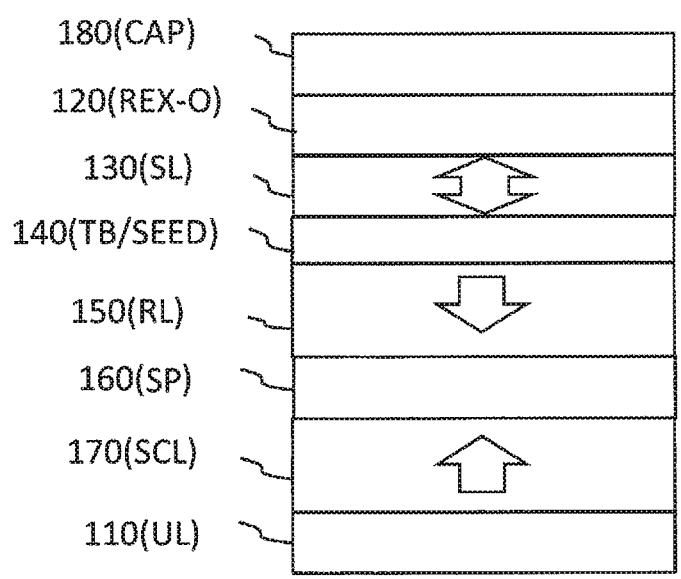
FIG. 13 is a cross-sectional view for explaining a configuration of a magnetoresistive effect element of a magnetic device according to one of the other modifications.

Specifically, FIG. 13 shows an example where an oxide layer includes a rare-earth oxide and a diffusivity adjusting oxide. Specifically, in the magnetoresistive effect element 22 shown in FIG. 13, a non-magnetic layer 110 that functions as an under layer, a ferromagnetic layer 170 that functions as a shift canceling layer, an non-magnetic layer that functions as a spacer layer 160, a ferromagnetic layer 150 that functions as a reference layer, a non-magnetic layer 140 that functions as a tunnel barrier layer and a seed layer, a ferromagnetic layer 130 that functions as a storage layer, an oxide layer 120, and a non-magnetic layer 180 that functions as a capping layer are stacked in this order.

Figure 14:
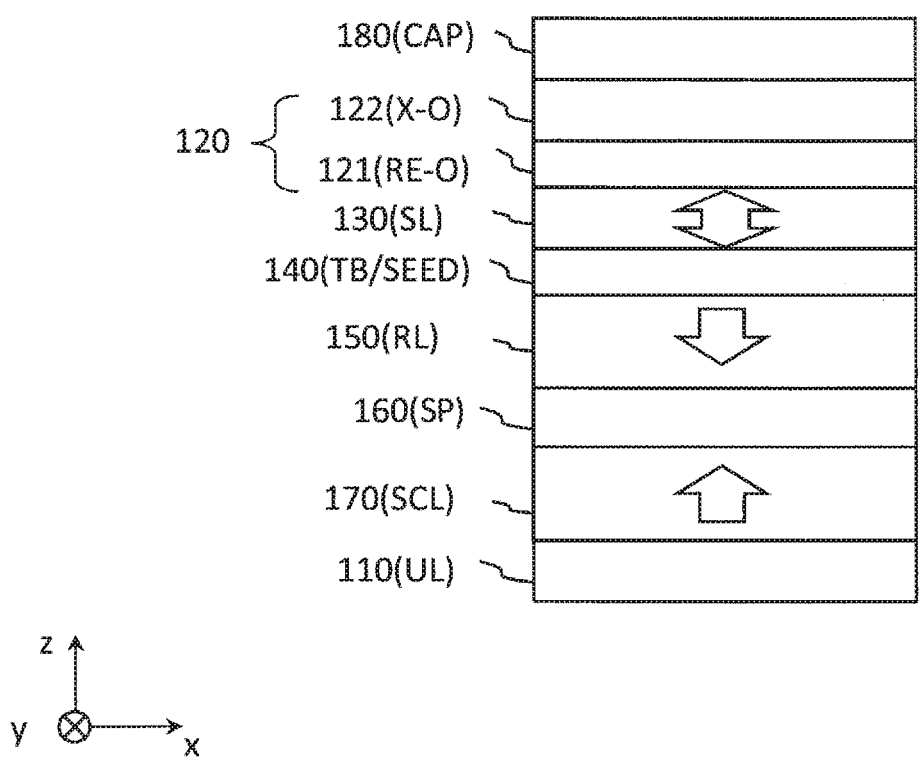
FIG. 14 is a cross-sectional view for explaining configuration of a magnetoresistive effect element of a magnetic device according to one of the other modifications.
Figure 15:
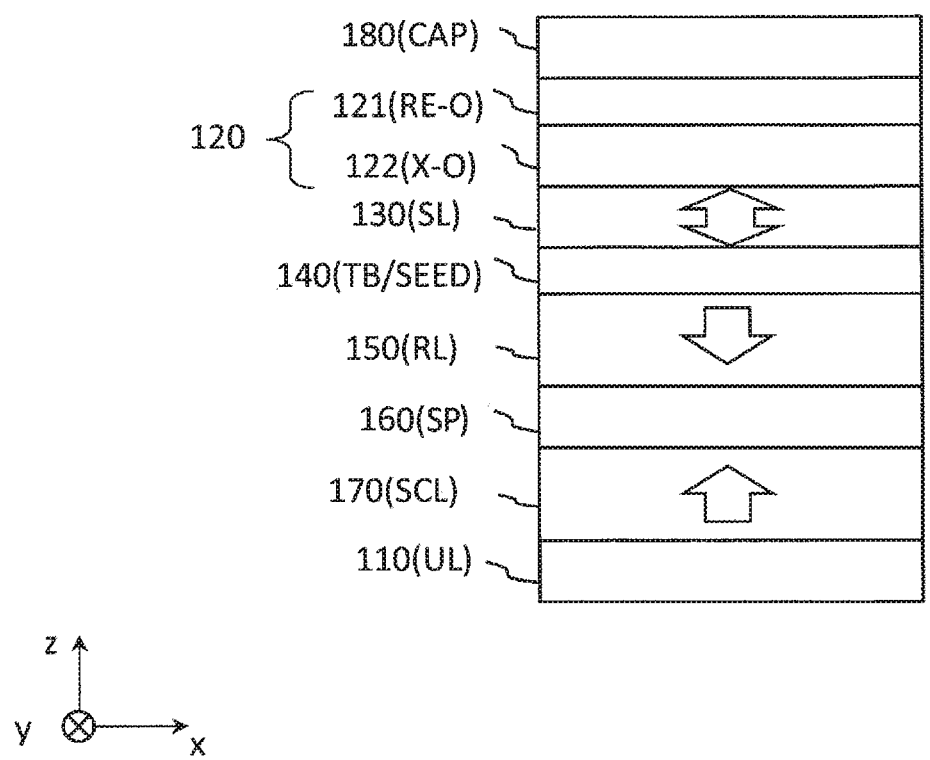
FIG. 15 is a cross-sectional view for explaining a configuration of a magnetoresistive effect element of a magnetic device according to one of the other modifications.

FIGS. 14 and 15 show cases where the oxide layer, which is included in the top-free type magnetoresistive effect, element 22 shown in FIG. 13, includes two layers: a rare-earth oxide layer and a diffusivity adjusting oxide layer. Specifically, in the magnetoresistive effect element 22 shown in FIG. 14, a rare-earth oxide layer 121 and diffusivity adjusting oxide layer 122 are stacked, in this order, between the ferromagnetic layer 130 and the none magnetic layer 180. In the magnetoresistive effect element 22 shown in FIG. 15, a diffusivity adjusting oxide layer 122 and a rare-earth oxide layer 121 are stacked, in this order, between the ferromagnetic layer 130 and the non-magnetic layer 180.

Figure 16:
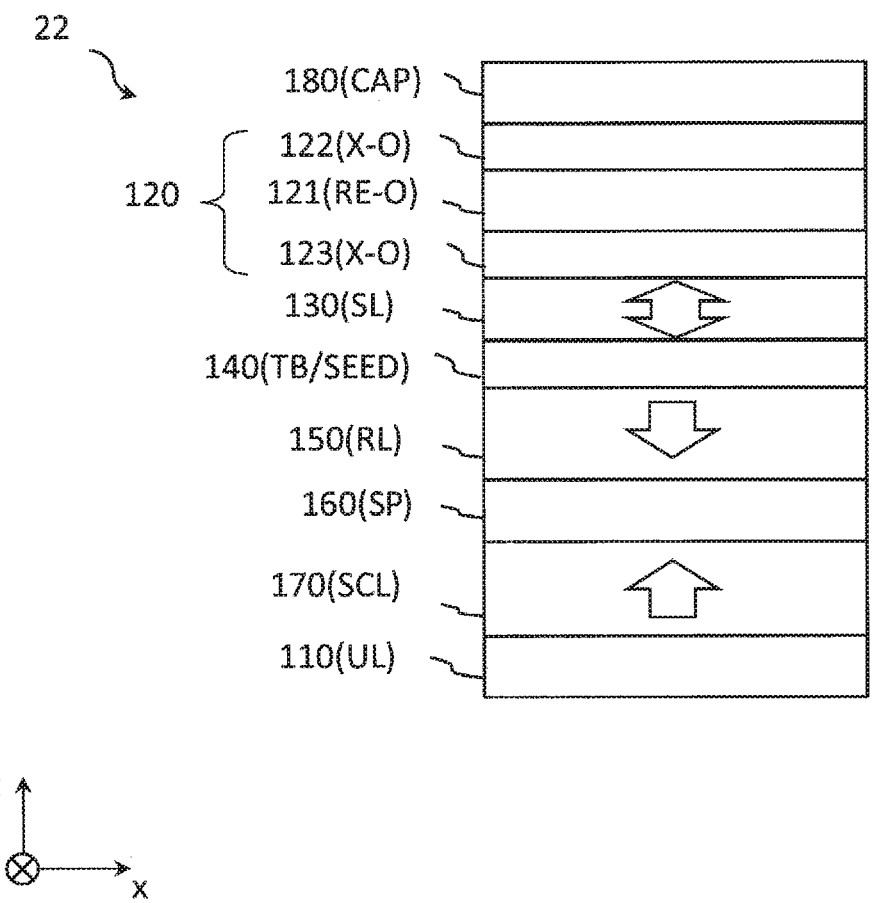
FIG. 16 is a cross-sectional view for explaining a configuration of a magnetoresistive 'effect element of a magnetic device according to one of the other modifications.

FIG. 16 shows a case where a rare-earth oxide layer is sandwiched between diffusivity adjusting oxide layers in the oxide layer, which is included in the top-free type magnetoresistive effect element 22 shown in FIG. 13. Specifically, in the magnetoresistive effect element 22 shown in FIG. 16, a diffusivity adjusting oxide layer 123, a rare-earth oxide layer 121, and a diffusivity adjusting oxide layer 122 are stacked, in this order, between the ferromagnetic layer 130 and the non-magnetic layer 180.

Figure 17:
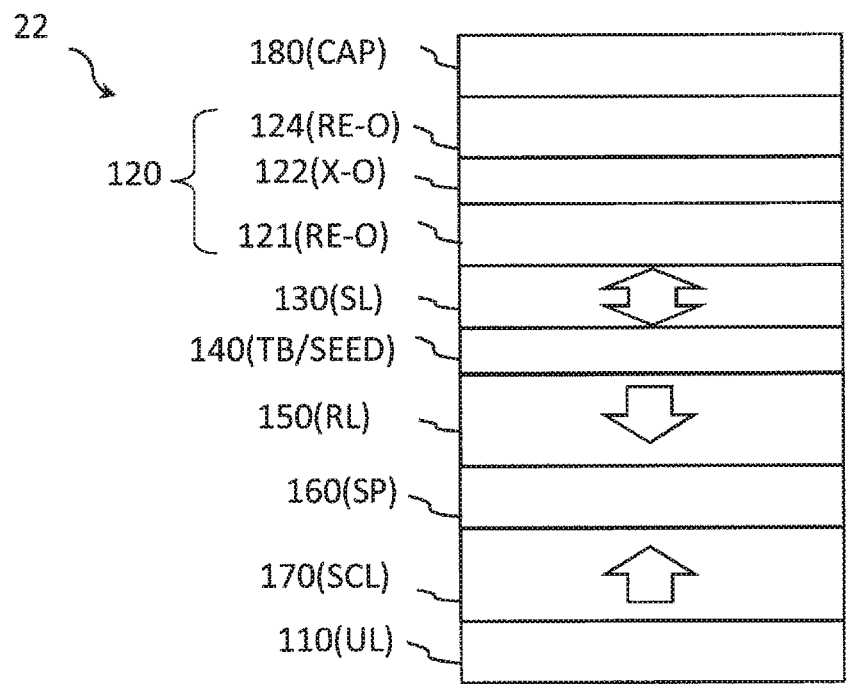
FIG. 17 is a cross-sectional view for explaining a configuration of a magnetoresistive effect element of a magnetic device according to one of the other modifications.

FIG. 17 shows a case where a diffusivity adjusting oxide layer is sandwiched between rare-earth oxide layers in the oxide layer, which is included in the top-free type magnetoresistive effect element 22 shown in FIG. 13. Specifically, in the magnetoresistive effect element 22 shown in FIG. 17, a rare-earth oxide layer 121, a diffusivity adjusting oxide layer 122, and a rare-earth oxide layer 124 are stacked, in this order, between the ferromagnetic layer 130 and the non-magnetic layer 180.

Furthermore, in the above first embodiment and the modifications, the magnetic storage device that includes the MTJ element is described as an example of a magnetic device that includes a magnetoresistive effect element; however, the configuration is not limited thereto. For example, the magnetic device includes another device that requires a magnetic element having perpendicular magnetic anisotropy, such as a sensor or media. The magnetic element is, for example, an element that includes at least the non-magnetic layer 110, the oxide layer 120, the ferromagnetic layer 130, and the non-magnetic layer 140 shown in FIG. 3. The non-magnetic layer 110 may be any kind of conductive material; that is, the non-magnetic layer 110 is nut limited to a non-magnetic material and may be a ferromagnetic material.

Furthermore, in the above first embodiment and the modifications, the switching element of the memory cell MC is described as the select transistor 25 which is an example of a switching element having three terminals in FIG. 1 and FIG. 2; however, the configuration is not limited thereto. For example, the switching element having two terminals can also be applied to the above first embodiment and the modifications.

That is, the select transistor may be, for example, a switch element operating between two terminals. As one example, in a case where a voltage applied between the two terminals is equal to or less than a threshold, the switch element is in a "high resistance" state, for example, an electrically non-conductive state. In a case where a voltage applied between the two terminals is equal to or larger than a threshold, the switch element changes to a "low resistance" state, for example, an electrically conductive state. The switch element can be configured to perform this function regardless of a polarity of voltage.

In this example, the switch element may include at least one chalcogen element selected from among a group configured with tellurium (Te), selenium (Se), and sulfur (S). Alternatively, the switch element may include chalcogenide that is a compound including the chalcogen element. In addition to this, the switch element may contain at least one element selected from among the group configured with boron (B), aluminum (Al), gallium (Ga), indium (In), carbon (C), silicon (Si), germanium (Ge), tin (Sn), arsenic (As), phosphorus (P), and Sb (antimony).

While certain embodiments have been described, these embodiments have been presented by way of example only, and are not intended to limit the scope of the inventions. Indeed, the novel embodiments described herein, may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A magnetic device comprising a magnetoresistive effect element, the magnetoresistive effect element including:
    a first ferromagnet;
    a conductor;
    an oxide provided between the first ferromagnet and the conductor, the oxide including a first oxide of a rare-earth element and a second oxide of an element of which a covalent radius is smaller than a covalent radius of the rare-earth element;
    a second ferromagnet; and
    a seed material provided between the first ferromagnet and the second ferromagnet,
    wherein the first ferromagnet is sandwiched between the seed material and the oxide.

2. The device of claim 1, wherein the rare-earth element in the first oxide includes at least one of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

3. The device of claim 2, wherein the oxide further includes at least one of boron (B), phosphorus (P), carbon (C), aluminum (Al), silicon (Si), tantalum (Ta), tungsten (W), molybdenum (Mo), chromium (Cr), hafnium (Hf), and titanium (Ti).

4. The device of claim 1, wherein the element in the second oxide includes at least one of sodium (Na), magnesium (Mg), aluminum (Al), silicon (Si), calcium (Ca), titanium (Ti), vanadium (V), chromium (Cr), manganese (Mn), zinc (Zn), strontium (Sr), zirconium (Zr), niobium (Nb), hafnium (Hf), and tantalum (Ta).

5. The device of claim 4, wherein the oxide further includes at least one of boron (B), phosphorus (P), carbon (C), aluminum (Al), silicon (Si), tantalum (Ta), tungsten (W), molybdenum (Mo), chromium (Cr), hafnium (Hf), and titanium (Ti).

6. The device of claim 1, wherein the oxide forms a single layer containing the first oxide and the second oxide.

7. The device of claim 1, wherein the oxide forms a first layer containing the first oxide and a second layer containing the second oxide.

8. The device of claim 7, wherein the first layer is provided between the second layer and the first ferromagnet.

9. The device of claim 7, wherein the second layer is provided between the first layer and the first ferromagnet.

10. The device of claim 1, wherein the seed material includes at least one of magnesium oxide (MgO), aluminum oxide (AlO), zinc oxide (ZnO), titanium oxide (TiO), and LSMO (lanthanum-strontium-manganese oxide).

11. The device of claim 1, wherein the conductor includes a non-magnetic material.

12. The device of claim 1, wherein the conductor includes a ferromagnetic material.

13. The device of claim 1, further comprising a memory cell that includes the magnetoresistive effect element.

* * * * *